United States Patent
Hashimoto

(10) Patent No.: US 6,410,364 B1
(45) Date of Patent: *Jun. 25, 2002

(54) SEMICONDUCTOR DEVICE, METHOD OF CONNECTING A SEMICONDUCTOR CHIP, CIRCUIT BOARD, AND ELECTRONIC EQUIPMENT

(75) Inventor: Nobuaki Hashimoto, Suwa (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/555,141

(22) PCT Filed: Sep. 3, 1999

(86) PCT No.: PCT/JP99/04787

§ 371 (c)(1),
(2), (4) Date: May 25, 2000

(87) PCT Pub. No.: WO00/19516

PCT Pub. Date: Apr. 6, 2000

(30) Foreign Application Priority Data

Sep. 30, 1998 (JP) .............................. 10-292934

(51) Int. Cl.[7] .............................................. H01L 21/44
(52) U.S. Cl. ....................... 438/118; 438/106; 257/787; 257/678
(58) Field of Search ................... 438/106, 118, 438/455; 257/678, 679, 688, 690, 791, 792, 793, 787

(56) References Cited

U.S. PATENT DOCUMENTS

| 4,749,120 A | * | 6/1988 | Hatada ........................ 228/123 |
| 5,169,056 A | * | 12/1992 | Reele et al. ................. 228/180 |
| 5,763,295 A | * | 6/1998 | Tokuno et al. ............... 438/118 |
| 5,926,694 A | | 7/1999 | Chigawa et al. |
| 6,107,120 A | * | 8/2000 | Ohtsuka et al. ............. 438/106 |
| 6,197,617 B1 | * | 3/2001 | Ohuchi et al. .............. 438/118 |

FOREIGN PATENT DOCUMENTS

| JP | A-1-226161 | 9/1989 |
| JP | A-4-82241 | 3/1992 |
| JP | A-4-352439 | 12/1992 |
| JP | A-5-63030 | 3/1993 |
| JP | A-9-51018 | 2/1997 |
| JP | A-9-82755 | 3/1997 |
| JP | A-9-306951 | 11/1997 |
| JP | A-10-50771 | 2/1998 |
| JP | A-10-270496 | 10/1998 |

* cited by examiner

Primary Examiner—Matthew Smith
Assistant Examiner—Renzo N. Rocchegiani
(74) Attorney, Agent, or Firm—Oliff & Berridge, PLC

(57) ABSTRACT

A semiconductor device comprises: a support member (20) on which a land (24) is formed; a semiconductor chip (10) having a bump for an electrode (12) that is disposed on the land (24), and to be bonded face-down to a support member (20); and resin (30) which is provided as an adhesive between the semiconductor chip (10) and the support member (20), which is allowed to contract on hardening, and which causes pressure-bonding between the land (24) and the bump (12) by the stress due to this hardening contraction. The stress therein is partially absorbed by elastic deformation of at least the support member (20).

27 Claims, 3 Drawing Sheets

SEMICONDUCTOR DEVICE, METHOD OF CONNECTING A SEMICONDUCTOR CHIP, CIRCUIT BOARD, AND ELECTRONIC EQUIPMENT

TECHNICAL FIELD

The present invention relates to a semiconductor device, a method of connecting a semiconductor chip, a circuit board, and electronic equipment.

BACKGROUND OF ART

Known methods of connecting a semiconductor chip utilize the hardening contraction of a resin. In a method disclosed in Japanese Patent Application Laid-Open No. 1-226161, for example, a semiconductor chip is disposed on a substrate, resin is injected therebetween, and an electrical connection between an electrode of the semiconductor chip and a circuit pattern on the substrate is created by the hardening contraction of the resin. This enables electrical connections by a simple process.

However, stress in the resin that has hardened on contraction and reaction force of the same order of magnitude are applied to the boundary surfaces between the semiconductor chip, the substrate, and the resin, so that releasing can easily occur. If releasing occurs, the maintaining force thereof becomes insufficient and it is no longer possible to ensure an electrical connection.

DISCLOSURE OF INVENTION

The present invention solves the above described problem and has as an objective thereof the provision of a semiconductor device, a method of connecting a semiconductor chip, a circuit board, and electronic equipment that make it possible to preserve electrical connections and ensure the stablility thereof.

1) A semiconductor device in accordance with one aspect of the present invention comprises:

a support member on which is formed an interconnecting pattern including a land;

a semiconductor chip to be bonded face-down to the support member and having a bump for an electrode that is disposed on the land; and resin which provides adhesion between the semiconductor chip and the support member and which contracts on hardening, to cause the land and the bump to be pressure-bonded by stress due to the hardening contraction, wherein the stress is partially absorbed by elastic deformation of the support member, without changing the shape of the land.

With this aspect of the invention, the semiconductor chip and the support member are pulled together by stress generated by the hardening contraction of the resin, so that the land and bump are pressure-bond to form an electrical connection. Since the support member deforms elastically, the stress generated by the hardening contraction of the resin is partially absorbed thereby. As a result, reaction force is reduced so that force applied to the boundary surfaces between the semiconductor chip, the support member, and the resin are also reduced, preventing releasing. This improves the reliability of the electrical connection between the land and the bump, in a stable manner.

In addition, this aspect of the invention makes it possible to maintain the shape of the land, enabling a stable electrical connection with no modification in the electrical characteristics of the land.

2) With this semiconductor device:

the support member may comprise a substrate and an adhesive which bonds the interconnecting pattern to the substrate and which also deforms elastically.

Since the adhesive deforms elastically, this ensures that the stress is partially absorbed thereby.

3) With this semiconductor device:

the relationship between the elastic modulus $E_M$ of the resin and the elastic modulus $E_A$ of the adhesive may be such that:

$E_M > E_A$.

In other words, the adhesive is easier to deform elastically than the resin, so that the stress may be absorbed partially by the adhesive.

4) With this semiconductor device:

the support member may be a substrate on which the interconnecting pattern is formed directly and which has deformed elastically.

Since the substrate deforms elastically, this ensures that the stress is partially absorbed thereby.

5) with this semiconductor device:

the relationship between the elastic modulus $E_M$ of the resin and the elastic modulus $E_S$ of the substrate may be such that:

$E_M > E_S$.

In other words, the substrate is easier to deform elastically than the resin, encouraging stress absorption by the substrate.

6) A semiconductor device in accordance with another aspect of the present invention comprises:

a substrate on which is formed an interconnecting pattern including a land, with an adhesive therebetween;

a semiconductor chip to be bonded face-down to the substrate and having a bump for an electrode that is disposed on the land; and resin which provides adhesion between the semiconductor chip and the substrate and which contracts on hardening, to cause the land and the bump to be pressure-bonded by stress due to the hardening contraction, wherein the relationship between the elastic modulus $E_M$ of the resin and the elastic modulus $E_A$ of the adhesive is such that:

$E_M > E_A$ and the stress is partially absorbed by elastic deformation of at least the adhesive.

with this aspect of the invention, the semiconductor chip and the substrate are pulled together by the stress generated by the hardening contraction of the resin, causing pressure-bonding of the land and the bump and ensuring an electrical connection therebetween. Since the adhesive deforms elastically, the stress generated by the hardening contraction of the resin is partially absorbed thereby. As a result, reaction force is reduced so that force applied to the boundary surfaces between the semiconductor chip, the substrate, and the resin are also reduced, preventing releasing. This improves the reliability of the electrical connection between the land and the bump, in a stable manner.

In addition, the adhesive is easier to deform elastically than the resin, encouraging stress absorption by the adhesive.

7) A semiconductor device in accordance with still another aspect of the present invention comprises:

a substrate on which is directly formed an interconnecting pattern including a land;

a semiconductor chip to be bonded face-down to the substrate and having a bump for an electrode that is disposed on the land; and resin which provides adhesion between the semiconductor chip and the substrate and which contracts on hardening, to cause the land and the bump to be pressure-bonded by stress due to the hardening contraction, wherein the relationship between the elastic modulus $E_M$ of the resin and the elastic modulus $E_S$ of the substrate is such that:

$E_M > E_S$ and the stress is partially absorbed by elastic deformation of at least the substrate.

With this aspect of the invention, the semiconductor chip and the substrate are pulled together by the stress generated by the hardening contraction of the resin, causing pressure-bonding of the land and the bump and ensuring an electrical connection therebetween. Since the substrate deforms elastically, the stress generated by the hardening contraction of the resin is partially absorbed thereby. As a result, reaction force is reduced so that force applied to the boundary surfaces between the semiconductor chip, the substrate, and the resin are also reduced, preventing releasing. This improves the reliability of the electrical connection between the land and the bump, in a stable manner.

In addition, the substrate is easier to deform elastically than the resin, encouraging stress absorption by the substrate.

8) The present invention also applies to a circuit board on which is formed an interconnecting pattern including a land, with an adhesive therebetween, wherein a semiconductor chip is bonded face-down to the circuit board by disposing a bump for an electrode on the land; resin provides adhesion between the semiconductor chip and the circuit board and contracts on hardening, the land and the bump are pressure-bonded by stress due to the hardening contraction, and the stress is partially absorbed by elastic deformation of the adhesive, without changing the shape of the land.

with this aspect of the invention, the semiconductor chip and the circuit board are pulled together by the stress generated by the hardening contraction of the resin, causing pressure-bonding of the land and the bump and ensuring an electrical connection therebetween. Since the adhesive deforms elastically, the stress generated by the hardening contraction of the resin is partially absorbed thereby. As a result, reaction force is reduced so that force applied to the boundary surfaces between the semiconductor chip, the circuit board, and the resin are reduced, preventing releasing. This improves the reliability of the electrical connection between the land and the bump, in a stable manner.

In addition, this aspect of the invention makes it possible to maintain the shape of the land, enabling a stable electrical connection with no modification in the electrical characteristics of the land.

9) With this circuit board:

the relationship between the elastic modulus $E_M$ of the resin and the elastic modulus $E_A$ of the adhesive may be such that:

$E_M > E_A$.

In other words, the adhesive is easier to deform elastically than the resin, encouraging stress absorption by the adhesive.

10) The present invention further applies to a circuit board on which is directly formed an interconnecting pattern including a land, wherein a semiconductor chip is bonded face-down to the circuit board by disposing a bump for an electrode on the land, resin provides adhesion between the semiconductor chip and the circuit board and contracts on hardening, the land and the bump are pressure-bonded by stress due to the hardening contraction, and the stress is partially absorbed by elastic deformation of the circuit board, without changing the shape of the land.

With this aspect of the invention, the semiconductor chip and the circuit board are pulled together by the stress generated by the hardening contraction of the resin, causing pressure-bonding of the land and the bump and ensuring an electrical connection therebetween. Since the circuit board deforms elastically, the stress generated by the hardening contraction of the resin is partially absorbed thereby. As a result, reaction force is reduced so that force applied to the boundary surfaces between the semiconductor chip, the circuit board, and the resin are reduced, preventing releasing. This improves the reliability of the electrical connection between the land and the bump, in a stable manner.

In addition, this aspect of the invention makes it possible to maintain the shape of the land, enabling a stable electrical connection with no modification in the electrical characteristics of the land.

11) With this circuit board:

the relationship between the elastic modulus $E_M$ of the resin and the elastic modulus $E_S$ of the circuit board may be such that:

$E_M > E_S$.

In other words, the circuit board is easier to deform elastically than the resin, encouraging stress absorption by the circuit board.

12) The present invention still further applies to a circuit board on which is formed an interconnecting pattern including a land, with an adhesive therebetween, wherein a semiconductor chip is bonded face-down to the circuit board by disposing a bump for an electrode on the land, resin provides adhesion between the semiconductor chip and the circuit board and contracts on hardening, and the land and the bump are pressure-bonded by stress due to the hardening contraction;

wherein the relationship between the elastic modulus $E_M$ of the resin and the elastic modulus $E_A$ of the adhesive is such that:

$E_M > E_A$; and wherein the stress is partially absorbed by elastic deformation of at least the adhesive.

With this aspect of the invention, the semiconductor chip and the circuit board are pulled together by the stress generated by the hardening contraction of the resin, causing pressure-bonding of the land and the bump and ensuring an electrical connection therebetween. Since the adhesive deforms elastically, the stress generated by the hardening contraction of the resin is partially absorbed thereby. As a result, reaction force is reduced so that force applied to the boundary surfaces between the semiconductor chip, the circuit board, and the resin are reduced, preventing releasing. This improves the reliability of the electrical connection between the land and the bump, in a stable manner.

In addition, the adhesive is easier to deform elastically than the resin, encouraging stress absorption by the adhesive.

13) The present invention yet further applies to a circuit board on which is directly formed an interconnecting pattern including a land, wherein a semiconductor chip is bonded face-down to the circuit board by disposing a bump for an electrode on the land, resin provides adhesion between the semiconductor chip and the circuit board and contracts on hardening, and the land and the bump are pressure-bonded by stress due to the hardening contraction;

wherein the relationship between the elastic modulus $E_M$ of the resin and the elastic modulus $E_S$ of the circuit board is such that:

$E_M > E_S$; and wherein the stress is partially absorbed by elastic deformation of at least the circuit board.

With this aspect of the invention, the semiconductor chip and the circuit board are pulled together by the stress generated by the hardening contraction of the resin, causing pressure-bonding of the land and the bump and ensuring an electrical connection therebetween. Since the circuit board deforms elastically, the stress generated by the hardening contraction of the resin is partially absorbed thereby. As a result, reaction force is reduced so that force applied to the boundary surfaces between the semiconductor chip, the circuit board, and the resin are reduced, preventing releasing. This improves the reliability of the electrical connection between the land and the bump, in a stable manner.

In addition, the circuit board is easier to deform elastically than the resin, encouraging stress absorption by the circuit board.

14) Electronic equipment in accordance with further aspect of the present invention has the above described semiconductor device.

15) Electronic equipment in accordance with still further aspect of the present invention has the above-described circuit board.

16) A method of connecting a semiconductor chip in accordance with still further aspect of the present invention comprises:

a step of bonding a semiconductor chip in a face-down manner to a support member on which is formed an interconnecting pattern including a land, in such a manner that a bump for an electrode is disposed on the land; and a step of providing a resin as an adhesive between the semiconductor chip and the support member, causing the resin to harden on contraction, and pressure-bonding the land and the bump by stress due to the hardening contraction, wherein the shape of the land is maintained while the support member is deformed elastically, to absorb the stress partially.

With this aspect of the invention, the semiconductor chip and the support member are pulled together by the stress generated by the hardening contraction of the resin, causing pressure-bonding of the land and the bump and ensuring an electrical connection therebetween. Since the support member deforms elastically, the stress generated by the hardening contraction of the resin is partially absorbed thereby. As a result, reaction force is reduced and force applied to the boundary surfaces between the semiconductor chip, the support member, and the resin can be reduced, thus preventing releasing. This improves the reliability of the electrical connection between the land and the bump, in a stable manner.

In addition, this aspect of the invention makes it possible to maintain the shape of the land, enabling a stable electrical connection with no modification in the electrical characteristics of the land.

17) With this method of connecting a semiconductor chip:

the support member may comprise a substrate and an adhesive which bonds the interconnecting pattern to the substrate and which also deforms elastically; and the adhesive may be deformed elastically.

Since the adhesive deforms elastically, this ensures that the stress is partially absorbed thereby.

18) With this method of connecting a semiconductor chip:

the relationship between the elastic modulus $E_M$ of the resin and the elastic modulus $E_A$ of the adhesive may be such that:

$E_M > E_A$.

In other words, the adhesive is easier to deform elastically than the resin, encouraging stress absorption by the adhesive.

19) With this method of connecting a semiconductor chip:

the support member may be a substrate on which the interconnecting pattern is formed directly; and the substrate may be deformed elastically.

Since the substrate deforms elastically, this ensures that the stress is partially absorbed thereby.

20) With this method of connecting a semiconductor chip:

the relationship between the elastic modulus $E_M$ of the resin and the elastic modulus $E_S$ of the substrate may be such that:

$E_M > E_S$.

In other words, the substrate is easier to deform elastically than the resin, encouraging stress absorption by the substrate.

21) A method of connecting a semiconductor chip in accordance with still further aspect of the present invention comprises:

a step of bonding a semiconductor chip in a face-down manner to a substrate on which is formed an interconnecting pattern including a land, with an adhesive therebetween, in such a manner that a bump for an electrode is disposed on the land;

a step of providing a resin as an adhesive between the semiconductor chip and the substrate, causing the resin to harden on contraction, and pressure-bonding the land and the bump by stress due to the hardening contraction, wherein the relationship between the elastic modulus $E_M$ of the resin and the elastic modulus $E_A$ of the adhesive is such that:

$E_M > E_A$; and wherein at least the adhesive is deformed elastically, to absorb the stress partially.

With this aspect of the invention, the semiconductor chip and the substrate are pulled together by the stress generated by the hardening contraction of the resin, causing pressure-bonding of the land and the bump and ensuring an electrical connection therebetween. Since the adhesive deforms elastically, the stress generated by the hardening contraction of the resin is partially absorbed thereby. As a result, reaction force is reduced and force applied to the boundary surfaces between the semiconductor chip, the support member, and the resin can also be reduced, preventing releasing. This improves the reliability of the electrical connection between the land and the bump, in a stable manner.

In addition, the adhesive is easier to deform elastically than the resin, encouraging stress absorption by the adhesive.

22) A method of connecting a semiconductor chip in accordance with yet further aspect of the present invention comprises:

a step of bonding a semiconductor chip in a face-down manner to a substrate on which is directly formed an interconnecting pattern including a land, in such a manner that a bump for an electrode is disposed on the land; and a step of providing a resin as an adhesive between the semiconductor chip and the substrate, causing the resin to harden on contraction, and pressure-bonding the land and the bump by stress due to the hardening contraction, wherein the relationship between the elastic modulus $E_M$ of the resin and the elastic modulus $E_S$ of the substrate is such that:

$E_M > E_S$; and wherein at least the substrate is deformed elastically, to absorb the stress partially.

With this aspect of the invention, the semiconductor chip and the substrate are pulled together by the stress generated by the hardening contraction of the resin, causing pressure-bonding of the land and the bump and ensuring an electrical connection therebetween. Since the substrate deforms elastically, the stress generated by the hardening contraction of the resin is partially absorbed thereby. As a result, reaction force is reduced and force applied to the boundary surfaces between the semiconductor chip, the substrate, and the resin can be reduced, thus preventing releasing. This improves the reliability of the electrical connection between the land and the bump, in a stable manner.

In addition, the substrate is easier to deform elastically than the resin, encouraging stress absorption by the substrate.

BEST MODE FOR CARRYING OUT THE INVENTION

Figure 1A:
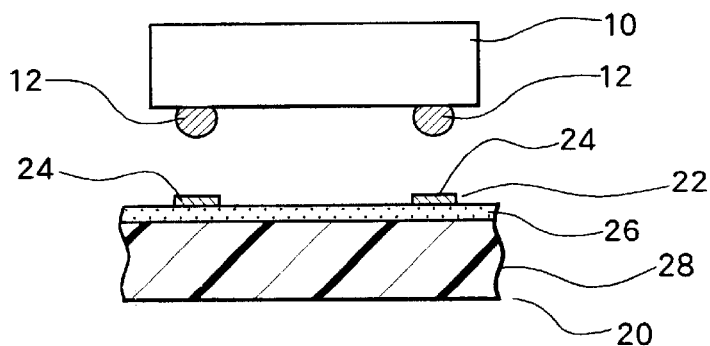
FIGS. 1A to 1D illustrate a method of connecting a semiconductor chip and a connection configuration in accordance with an embodiment to which the present invention is applied.

Preferred embodiments of the present invention are described below with reference to the accompanying drawings.

The description first concerns a method of connecting a semiconductor chip in accordance with an embodiment of the present invention, with reference to FIGS. 1A to 1D. In this embodiment of the invention, a semiconductor chip 10 is connected to a support member 20.

The semiconductor chip 10 has one or more bumps 12, where each of these bumps 12 acts as an electrode for electrical connection with the circuitry within the semiconductor chip 10. Note that these bumps 12 may be formed of a conductive material such as gold, copper, nickel, or solder, and may be formed to be spherical-shape or rectangular parallelepiped, provided they protrude from the base surface (active surface) of the semiconductor chip 10. Bumps 12 of a height on the order of 5 μm to 500 μm are often used; when they are of gold, they are often of a height on the order of 5 μm to 30 μm. Alternatively, these bumps may be formed on a land 24 side of an interconnecting pattern 22, and may be a structure called a bump TAB (BTAB) in which the lands 24 are etched.

The interconnecting pattern 22 is formed on the support member 20. The interconnecting pattern 22 comprises the lands 24 on which the bumps 12 of the semiconductor chip 10 will be mounted. The lands 24 are formed to correspond in number and position with the bumps 12.

In this application, the support member 20 refers to a member on which the interconnecting pattern 22 is formed. The support member 20 in this embodiment of the invention is an adhesive 26 and a substrate 28, by way of example. The adhesive 26 is interposed between the substrate 28 and the interconnecting pattern 22 to form a three-layer substrate. Alternatively, the configuration maybe such that a multi-layer structure formed of a stack of layers of insulating resin and interconnecting patterns is formed on a substrate, or a plurality of substrates may be superimposed to form a multi-layer substrate. In addition to the interconnecting pattern 22 on one surface of the substrate 28, another interconnecting pattern may be formed on the other surface. Note that an example in which the substrate alone acts as a support member, with no adhesive, will be described later with reference to FIG. 3.

The substrate 28 that forms part of the support member 20 is a circuit board in accordance with this embodiment. The substrate 28 may be formed of either an organic or inorganic material, or it may be formed of a compound structure thereof. An example of the substrate 28 formed of an organic material is a flexible substrate made of a polyimide resin. Examples of the substrate 28 formed of an inorganic material include a ceramic substrate and a glass substrate. An example of a structure that is a compound of organic and inorganic materials is a glass epoxy substrate. The elastic modulus of the substrate 28 is not specifically limited in this embodiment, but it is preferably small. Note that the following examples are known as the elastic modulus of the substrate 28:

Flexible substrate: 60 kg/mm$^2$

Glass epoxy substrate: 1,100 kg/mm$^2$

Ceramic substrate: 350,000 kg/mm$^2$

In this embodiment of the invention, resin 30 is used to ensure that face-down bonding structure of the semiconductor chip 10 on the support member 20 is maintained. The resin 30 provides adhesion between the semiconductor chip 10 and the support member 20, and the bumps 12 and the lands 24 are pressure-bonded together by the stress induced by the contraction of the resin 30 on hardening, or the thermal contraction thereof (which will be described later), or both the hardening contraction and the thermal contraction. It is therefore general to use a light-hardening resin or thermal-hardening resin which contracts on hardening, as the resin 30. In addition, the resin 30 preferably has a high adhesive strength with respect to the semiconductor chip 10 and the support member 20.

In this embodiment, the relationship between the elastic modulus $E_A$ of at least a part (the adhesive 26) of the support member 20 after hardening and the elastic modulus $E_M$ of the resin 30 after hardening is:

$E_M > E_A$

For example:

$E_M = 150$ kg/mm$^2$;

$E_A = 60$ kg/mm$^2$

In other words, the adhesive 26 is made to be easier than the resin 30 to deform elastically in the direction of thickness of the semiconductor chip 10 and the substrate 28, in response to internal stress due to the contraction on hardening of the resin 30, or internal stress due to the volumetric contraction generated by the cooling from a hot state of the resin 30 if it is a thermal-hardening resin, or internal stress due to both hardening contraction and volumetric contraction.

In this embodiment of the invention, the semiconductor chip 10 is connected by using a member of the above described configuration, as described below.

Figure 1B:
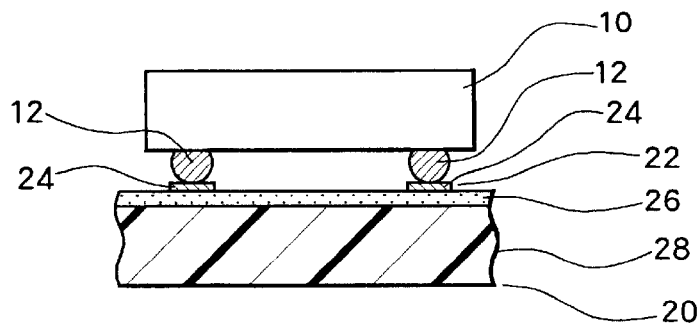

First of all, the support member 20 on which is formed the interconnecting pattern 22 is prepared, as shown in FIG. 1A. The support member 20 comprises the adhesive 26 and the substrate 28. The bumps 12 of the semiconductor chip 10 are then positioned above the lands 24 of the interconnecting pattern 22 so that the bumps 12 are disposed on the lands 24, as shown in FIG. 1B.

Figure 1C:
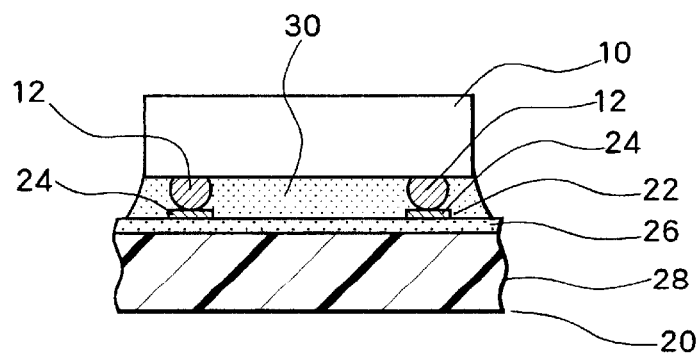

The resin 30 is then injected into the space between the semiconductor chip 10 and the support member 20 (the adhesive 26), as shown in FIG. 1C. The resin 30 is then subjected to hardening appropriate to the composition thereof, to cause the resin 30 to exhibit hardening contraction. Stress generated by the hardening contraction, thermal contraction, or both the hardening contraction and thermal contraction act to decrease the space between the semiconductor chip 10 and the support member 20. As a result, the bumps 12 and the lands 24 are pressure bonded to form electrical connections therebetween. Alternatively, the resin 30 maybe painted or applied in a liquid form or sheet form on the surface of the semiconductor chip 10 on which the active elements are formed, or on the support member 20 facing that surface. The resin 30 used may also be an anisotropic conductive adhesive into which is mixed some conductive particles.

In this embodiment of the invention, the relationship between the elastic modulus $E_A$ of the adhesive 26 after hardening and the elastic modulus $E_M$ of the resin 30 after hardening is:

$E_M > E_A$.

Thus the adhesive 26 is deformed elastically by the stress generated by the hardening contraction of the resin 30, or the thermal contraction thereof, or both the hardening contraction and the thermal contraction thereof. The lands 24 sink into the layer formed of the adhesive 26, as shown by way of example in FIG. 1D. In addition, at least one of the bumps 12, the lands 24, and the substrate 28 may be made to deform elastically.

The thus obtained connection configuration makes it possible to partially absorb the stress generated by the hardening contraction of the resin 30 and also weaken the force that is generated in opposite directions in the boundary surfaces between the semiconductor chip, the support member 20, and the resin 30, thus making it difficult for releasing to occur. This also improves the reliability of the electrical connections between the bumps 12 and the lands 24.

Figure 2:
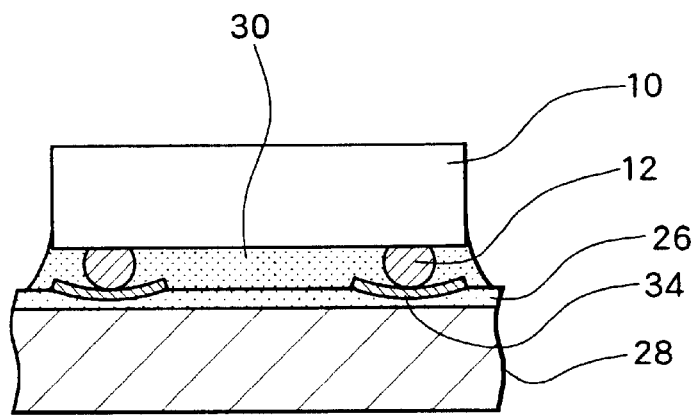
FIG. 2 illustrates a modification on this embodiment of the invention.

A modification of the above described embodiment of the invention is shown in FIG. 2. This modification differs from the above described embodiment in that lands 34 shown in this figure are larger in plan, or are thinner, or are made of a softer material than the lands 24 of FIG. 1A, or the adhesive 26 is made to be softer than the lands 24 of FIG. 1A. All other components and methods are similar to those of the above described embodiment, and thus are denoted by the same reference numerals.

Figure 1D:
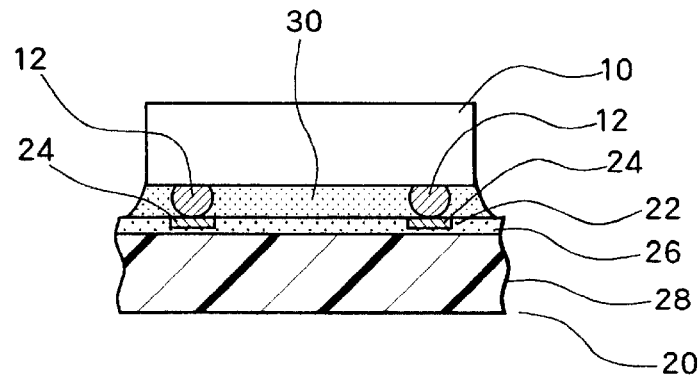

In the previously described embodiment of the invention, the lands 24 sink into the layer formed of the adhesive, without deforming substantially, as shown in FIG. 1D. In contrast thereto, the lands 34 of the example shown in FIG. 2 also deform due to the stress generated by the hardening contraction of the resin 30, as the adhesive 26 deforms elastically for the previously described reasons. Note that it is preferable that the deformation of the lands 34 is elastic deformation. This configuration makes it possible to achieve the same effects as those of the above described embodiment of the invention.

Figure 3:
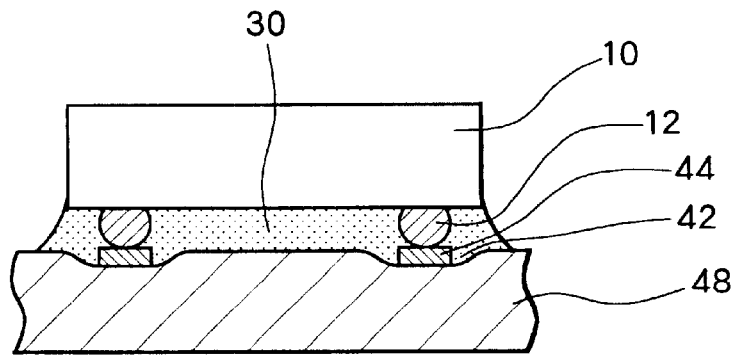
FIG. 3 illustrates another modification on this embodiment of the invention.

Another modification on the above described embodiment is shown in FIG. 3. In this modification, a support member 48 which does not include an adhesive is used. In other words, a conductive film of a material such as copper is deposited on the support member 48 by a method such as sputtering, then this is etched to form an interconnecting pattern 42 comprising lands 44. In this case, the interconnecting pattern 42 is formed directly on the support member 48 to configure a two-layer substrate with no adhesive therebetween. The relationship between the elastic modulus $E_S$ of the support member 48 and the elastic modulus $E_M$ of the resin 30 is:

$E_M > E_S$.

For example:

$E_M = 150$ kg/mm$^2$;

$E_S = 60$ kg/mm$^2$

In other words, the support member 48 is easier to deform elastically than the resin 30. This relationship can be achieved if the support member 48 is a flexible substrate made of a polyimide resin, by way of example. All other components and methods are similar to those of the above described embodiment, and thus are denoted by the same reference numerals.

In the example shown in FIG. 3, the support member 48, acting as a substrate, deforms elastically due to the stress generated by the hardening contraction of the resin 30. This elastic deformation makes it possible to partially absorb the stress generated by the hardening contraction and/or thermal contraction of the resin 30. In addition, the bumps 12 may also deform elastically. This configuration also makes it possible to achieve the same effects as those of the above described embodiments. Note that the support member 48 is shown in a greatly deformed state in FIG. 3, to make this state clear, but in actual practice it is considered that this deformation will not be discernible to the naked eye. In addition, the adhesive surface of the resin 30 with respect to the support member 48 may be deformed by being warped in a bimetal manner. Note that the support member 20 in the three-layer substrate of FIG. 1D is also thought to deform in accordance with the elastic modulus thereof, when viewed on a microscopic level.

Figure 4:
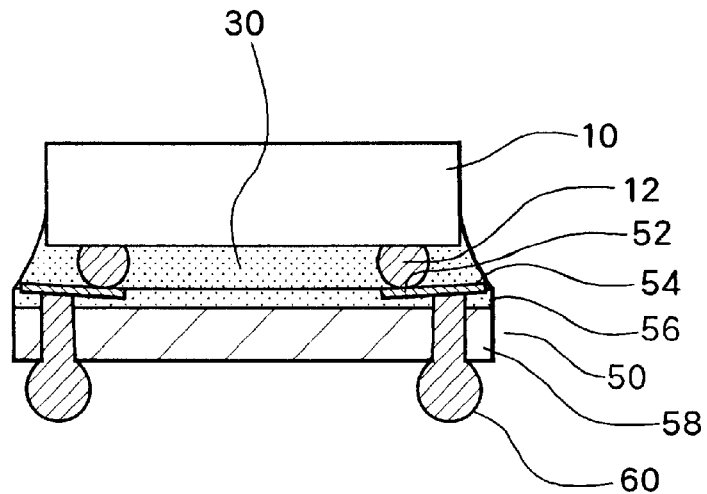
FIG. 4 shows a semiconductor device fabricated in accordance with the present invention.

A further modification of the above described embodiment is shown in FIG. 4. This example relates to the fabrication of a semiconductor device to which is applied the connection configuration of the semiconductor chip of the present invention. The semiconductor device is shown in FIG. 4 as a completed product. In this semiconductor device, the semiconductor chip 10 is bonded face-down to a support member 50. In this case, the support member 50 comprises an adhesive 56 and a substrate 58, and an interconnecting pattern 52 is formed thereon. The interconnecting pattern 52 comprises lands 54 that are connected electrically to external electrodes 60 by conductive members that pass through the substrate 58. Each of the external electrodes 60 is formed of a solder ball or the like.

Note that the previously described substrate 28 may also be selected for use as the support member 50. The configuration may be such that a multi-layer structure formed of a stack of layers of insulating resin and interconnecting patterns is formed on the support member 50, or a plurality of substrates may be superimposed to form a multi-layer substrate. All other components and methods are similar to those of the above described embodiment of the invention, and thus are denoted by the same reference numerals.

In the example shown in FIG. 4 too, the layer formed of the adhesive 56 deforms elastically in such a manner that at least part of each of the lands 54 sinks thereinto, so that the stress is partially absorbed. This example also makes it possible to achieve the same effects as those of the above described embodiment. Note that at least one of the bumps 12, the lands 54, and the substrate 58 may be made to deform elastically in this example too.

The present invention can be applied to a chip scale/size package (CSP) type of semiconductor device, or a face-down type of semiconductor device in which at least one semiconductor chip is mounted, or a module configuration thereof. A semiconductor device of face-down type may be a chip-on-flex/film (COF) or a chip-on-board (COB) structure, by way of example. The present invention can also be applied to a CSP semiconductor device in which a plurality of semiconductor chips are mounted.

The semiconductor device shown in FIG. 4 may have the external electrodes 60, or part of the substrate 58 may be extended to provide external connections therefrom. Part of the substrate 58 may form a connector lead, connectors may be installed on the substrate 58, or the interconnecting pattern 52 of the substrate 58 itself may be connected to other electronic equipment.

In addition, the configuration may be such that the external electrodes 60 are not formed in actuality, but a solder cream is provided to the motherboard side when the device is mounted on a motherboard is used effectively so that the surface tension of the solder cream when melted forms external electrodes. Such a semiconductor device is called a land grid array type of semiconductor device.

As described above, this embodiment of the invention ensure that local elastic deformation occurs within a structure formed of the semiconductor chip, bumps, lands, and support member, due to the hardening or thermal contraction force of resin in accordance with the elastic modulus of these components, to ensure that electrical connections between the bumps and the lands are maintained more stably.

Figure 5:
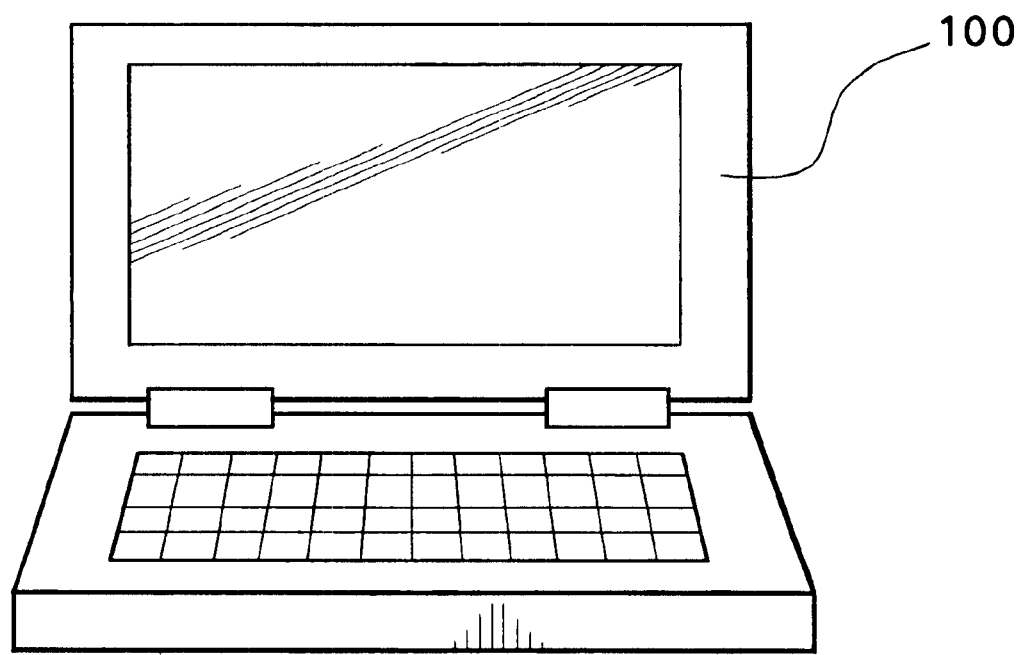
FIG. 5 shows electronic equipment having a circuit board or semiconductor device in accordance with the present invention.

A notebook-sized personal computer 100, which is an example of electronic equipment having a circuit board or semiconductor device to which the present invention is applied, is shown in FIG. 5.

Note that a semiconductor chip is used by way of example in this description of the invention, but the present invention may also be applied to an electronic component for surface mounting that requires a large number of bumps, similar to that of a semiconductor chip, regardless of whether this is an active component or a passive component. Examples of such electronic components include resistors, capacitors, coils, oscillators, filters, temperature sensors, thermistors, varistors, variable resistors, or fuses, by way of example.

In addition, a plurality of the semiconductor chips may be mounted in all of the previously described embodiments of the invention. In other words, it is possible to mix a semiconductor chip mounted by one of the previously described mounting methods, together with a semiconductor chip mounted by another mounting method, such as one that is mounted in a face-down manner, having a bonding portion around the semiconductor chip, or a semiconductor chip mounted by a wire bonding method. Furthermore, electronic components other than those semiconductor chips can be mixed with such semiconductor chips, to form a module type of semiconductor device.

What is claimed is:

1. A semiconductor device comprising:
    a support member on which is formed an interconnecting pattern including a land;
    a semiconductor chip to be bonded face-down to the support member and having a bump that is disposed on the land; and
    resin which provides adhesion between the semiconductor chip and the support member and which contracts on hardening, to cause the land and the bump to be pressure-bonded by stress due to the hardening contraction,
    wherein the stress is partially absorbed by elastic deformation of the support member, without changing the shape of the land.

2. The semiconductor device as defined by claim 1,
    wherein the support member comprises a substrate and an adhesive which bonds the interconnecting pattern to the substrate and which also deforms elastically.

3. The semiconductor device as defined by claim 2,
    wherein the relationship between the elastic modulus $E_M$ of the resin and the elastic modulus $E_A$ of the adhesive is such that:
    $E_M > E_A$.

4. The semiconductor device as defined by claim 1,
    wherein the support member is a substrate on which the interconnecting pattern is formed directly and which has deformed elastically.

5. The semiconductor device as defined by claim 4,
    wherein the relationship between the elastic modulus $E_M$ of the resin and the elastic modulus $E_S$ of the substrate is such that:
    $E_M > E_S$.

6. Electronic equipment having the semiconductor device as defined by claim 1.

7. A semiconductor device comprising:
    a substrate on which is formed an interconnecting pattern including a land, with an adhesive therebetween;
    a semiconductor chip to be bonded face-down to the substrate and having a bump that is disposed on the land; and
    resin which provides adhesion between the semiconductor chip and the substrate and which contracts on hardening, to cause the land and the bump to be pressure-bonded by stress due to the hardening contraction,
    wherein the relationship between the elastic modulus $E_M$ of the resin and the elastic modulus $E_A$ of the adhesive is such that:
    $E_M > E_A$
    and the stress is partially absorbed by elastic deformation of at least the adhesive.

8. Electronic equipment having the semiconductor device as defined by claim 7.

9. A semiconductor device comprising:
    a substrate on which is directly formed an interconnecting pattern including a land;
    a semiconductor chip to be bonded face-down to the substrate and having a bump that is disposed on the land; and
    resin which provides adhesion between the semiconductor chip and the substrate and which contracts on hardening, to cause the land and the bump to be pressure-bonded by stress due to the hardening contraction,
    wherein the relationship between the elastic modulus $E_M$ of the resin and the elastic modulus $E_S$ of the substrate is such that:

$E_M > E_S$ and the stress is partially absorbed by elastic deformation of at least the substrate.

10. Electronic equipment having the semiconductor device as defined by claim 9.

11. A circuit board on which is formed an interconnecting pattern including a land, with an adhesive therebetween, wherein a semiconductor chip is bonded face-down to the circuit board by disposing a bump on the land; resin provides adhesion between the semiconductor chip and the circuit board and contracts on hardening, the land and the bump are pressure-bonded by stress due to the hardening contraction, and the stress is partially absorbed by elastic deformation of the adhesive, without changing the shape of the land.

12. The circuit board as defined by claim 11, wherein the relationship between the elastic modulus $E_M$ of the resin and the elastic modulus $E_A$ of the adhesive is such that:

$E_M > E_A$.

13. Electronic equipment having the circuit board as defined by claim 11.

14. A circuit board on which is directly formed an interconnecting pattern including a land, wherein a semiconductor chip is bonded face-down to the circuit board by disposing a bump on the land, resin provides adhesion between the semiconductor chip and the circuit board and contracts on hardening, the land and the bump are pressure-bonded by stress due to the hardening contraction, and the stress is partially absorbed by elastic deformation of the circuit board, without changing the shape of the land.

15. The circuit board as defined by claim 14, wherein the relationship between the elastic modulus $E_M$ of the resin and the elastic modulus $E_S$ of the circuit board is such that:

$E_M > E_S$.

16. Electronic equipment having the circuit board as defined by claim 14.

17. A circuit board on which is formed an interconnecting pattern including a land, with an adhesive therebetween, wherein a semiconductor chip is bonded face-down to the circuit board by disposing a bump on the land, resin provides adhesion between the semiconductor chip and the circuit board and contracts on hardening, and the land and the bump are pressure-bonded by stress due to the hardening contraction;

wherein the relationship between the elastic modulus $E_M$ of the resin and the elastic modulus $E_A$ of the adhesive is such that:

$E_M > E_A$; and wherein the stress is partially absorbed by elastic deformation of at least the adhesive.

18. Electronic equipment having the circuit board as defined by claim 17.

19. A circuit board on which is directly formed an interconnecting pattern including a land, wherein a semiconductor chip is bonded face-down to the circuit board by disposing a bump on the land, resin provides adhesion between the semiconductor chip and the circuit board and contracts on hardening, and the land and the bump are pressure-bonded by stress due to the hardening contraction;

wherein the relationship between the elastic modulus $E_M$ of the resin and the elastic modulus $E_S$ of the circuit board is such that:

$E_M > E_S$; and wherein the stress is partially absorbed by elastic deformation of at least the circuit board.

20. Electronic equipment having the circuit board as defined by claim 19.

21. A method of connecting a semiconductor chip, the method comprising:

a step of bonding a semiconductor chip in a face-down manner to a support member on which is formed an interconnecting pattern including a land, in such a manner that a bump is disposed on the land; and a step of providing a resin as an adhesive between the semiconductor chip and the support member, causing the resin to harden on contraction, and pressure-bonding the land and the bump by stress due to the hardening contraction, wherein the shape of the land is maintained while the support member is deformed elastically, to absorb the stress partially.

22. The method of connecting a semiconductor chip as defined by claim 21, wherein the support member comprises a substrate and an adhesive which bonds the interconnecting pattern to the substrate and which also deforms elastically; and wherein the adhesive is deformed elastically.

23. The method of connecting a semiconductor chip as defined by claim 22, wherein the relationship between the elastic modulus $E_M$ of the resin and the elastic modulus $E_A$ of the adhesive is such that:

$E_M > E_A$.

24. The method of connecting a semiconductor chip as defined by claim 21, wherein the support member is a substrate on which the interconnecting pattern is formed directly; and wherein the substrate is deformed elastically.

25. The method of connecting a semiconductor chip as defined by claim 24, wherein the relationship between the elastic modulus $E_m$ of the resin and the elastic modulus $E_S$ of the substrate is such that:

$E_M > E_S$.

26. A method of connecting a semiconductor chip, the method comprising:

a step of bonding a semiconductor chip in a face-down manner to a substrate on which is formed an interconnecting pattern including a land, with an adhesive therebetween, in such a manner that a bump is disposed on the land;

a step of providing a resin as an adhesive between the semiconductor chip and the substrate, causing the resin to harden on contraction, and pressure-bonding the land and the bump by stress due to the hardening contraction, wherein the relationship between the elastic modulus $E_M$ of the resin and the elastic modulus $E_A$ of the adhesive is such that:

$E_M > E_A$; and wherein at least the adhesive is deformed elastically, to absorb the stress partially.

27. A method of connecting a semiconductor chip, the method comprising:

a step of bonding a semiconductor chip in a face-down manner to a substrate on which is directly formed an interconnecting pattern including a land, in such a manner that a bump is disposed on the land; and a step of providing a resin as an adhesive between the semiconductor chip and the substrate, causing the resin to harden on contraction, and pressure-bonding the land and the bump by stress due to the hardening contraction, wherein the relationship between the elastic modulus $E_M$ of the resin and the elastic modulus $E_S$ of the substrate is such that:

$E_M > E_S$; and wherein at least the substrate is deformed elastically, to absorb the stress partially.

* * * * *